TRANSISTOR SUPERHETERODYNE RECEIVER
Filed March 22, 1961
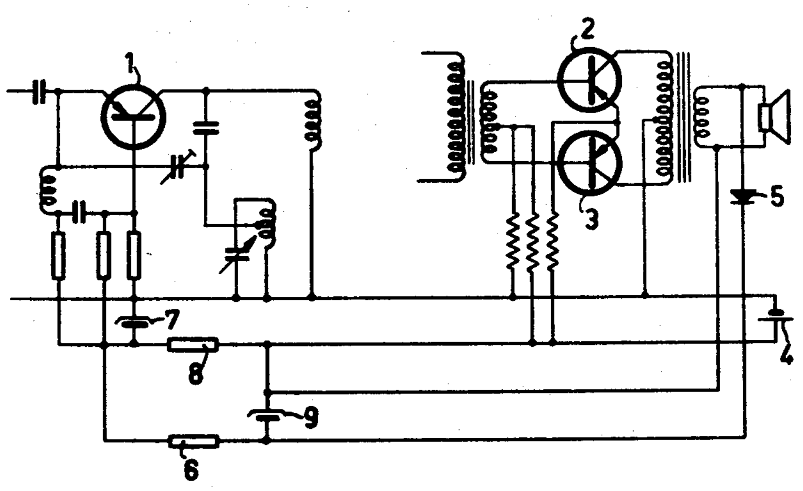
INVENTOR
WILLEM EBBINGE.
JACOBUS J. RONGEN.
BY
Frank R. Jeffrey [signature]
AGENT

United States Patent Office 3,181,066
Patented Apr. 27, 1965

3,181,066
TRANSISTOR SUPERHETERODYNE RECEIVER

Willem Ebbinge, Emmasingel, Eindhoven, and Jacobus Johannes Rongen, Mollenhutseweg, Nijmegen, Netherlands, assignors to North American Philips Company, Inc., New York, N.Y., a corporation of Delaware Filed Mar. 22, 1961, Ser. No. 97,521
Claims priority, application Germany, May 7, 1960, N 18,293
3 Claims. (Cl. 325—319)

The invention relates to a transistor-equipped superheterodyne receiver having a class audio output stage. Such output stages have the advantage that the useful effect is materially higher, with an adjustment to low sound intensity the supply current is accordingly lower. However, this gives rise to the difficulty that the current supplied by the supply source and hence the voltage produced by the supply source fluctuates with the signal amplitude. Transistor oscillators and particularly the local oscillator for producing the local oscillations are, however, particularly sensitive to supply voltage fluctuations; the locally produced frequency may vary to a high extent with the supply voltage.

The invention has for its object to provide measures to avoid this disadvantage. According to the invention, the signal voltages produced by the audio output stage are rectified and applied to a heterodyne oscillator, preferably a self-oscillating mixing stage, so that the supply voltage fluctuations produced by the output stage are compensated at the oscillator.

The invention will now be described more fully with reference to the embodiment shown in the drawing.

The receiver arrangement comprises a local oscillator 1 (which may be connected as a self-oscillating mixing stage as shown in the figure), and also a low-frequency stage with push-pull connected output transistors 2 and 3 in class B-connection. Owing to the class B-connection of the output stage 2, 3 a current varying with the signal amplitude is derived from the operating supply source 4, so that the terminal voltage of the supply source, for example a battery, varies with the signal amplitude. Since the frequency of the local oscillation depends intimately upon the value of the supply voltage, provision is made, in accordance with the invention, of a rectifier 5, which rectifies the signal voltages produced by the stage 2, 3 and thus produces a voltage corresponding to the supply voltage fluctuations across the smoothing capacitor 9. This voltage is applied to a capacitor 7 by way of a separation resistor 6. Capacitor 7 is also connected as a filter capacitor for the supply voltage derived by way of the resistor 8 from the source 4. In this way a reaction of the stage 2, 3 on the stage 1 is practically avoided.

In operation, the voltage appearing on capacitor 7 is applied as the operating voltage to the mixer-oscillator stage 1, and the operating current of this stage flows through resistor 8. If, in the absence of the compensating circuit of the present invention, the supply voltage at battery 4 drops due to loading by the class B output stage 2, the voltage across the capacitor 7 will also drop, and this drop in the operating voltage of the mixer-oscillator stage will result in a change in the local oscillator frequency. The increased loading by the class B stage is also accompanied by an increase in the alternating voltage output of the stage 2, and, according to the invention, this output voltage is rectified by rectifier 5, producing a charge on capacitor 9 proportional to the peak amplitude of the output signal. The capacitor 9 discharges through resistors 8 and 6, and the discharge current through the resistor 8 flows in the direction opposite to the flow therethrough of operating current of the stage 1. The discharge current of capacitor 9 thus reduces the voltage drop across the resistor 8 and consequently raises the operating voltage for the mixer-oscillator stage 1 appearing across capacitor 7. Since the output stage is a class B amplifier, the operating current for this stage is substantially proportional to the A.C. output voltage. Thus, the variation in the voltage drop in battery 4, which is proportional to current, will be substantially proportional to the A.C. output voltage. Consequently, with proper selection of the values of resistors 6 and 8, the voltage developed across resistor 8 due to the rectification of the output voltage may substantially compensate for variation in the supply voltage of the mixer-oscillator stage.

In a practical embodiment the capacitors 5 and 7 had each a value of 25 $\mu$f. and the resistors 6 and 8 had values of 300 and 100 $\Omega$ respectively. The voltage across the capacitor 7 was therefore substantially constant and the frequency variations of the local oscillator were thus very strongly reduced.

What is claimed is:

1. A transistor superheterodyne receiver circuit comprising oscillator means for producing local oscillations to be heterodyned with received waves, a reproducing device, output stage means comprising class B amplifier means connected to apply low frequency signals to said reproducing device, a source of a supply voltage, means applying said supply voltage to said class B amplifier means as the operating voltage therefor, rectifier means connected to rectify output signals of said amplifier means to produce a direct voltage having an amplitude dependent upon the amplitude of said output signals, and means applying said supply voltage and said direct voltage to said oscillator means as the operating voltage therefor, whereby the operating voltage of said oscillator is maintained substantially independent of fluctuations of said supply voltage due to variable loading thereof.

2. A transistor superheterodyne receiver comprising a local oscillator stage, a class B low frequency amplifier stage having an output circuit, a source of a supply voltage, means applying said supply voltage to said amplifier stage as an operating voltage therefor whereby said supply voltage fluctuates with the amplitude of signals in said output circuit, and means for providing an operating voltage for said local oscillator stage comprising rectifier means connected to said output circuit for providing a direct compensatory voltage, means connected to said source for providing a voltage proportional to said supply voltage, means for combining said proportional voltage and compensatory voltage to provide an operating voltage independent of variations of supply voltage fluctuations due to variation in amplitude of said signals, and means applying said last-mentioned operating voltage to said local oscillator stage.

3. In a transistor superheterodyne receiving circuit of the type having a local oscillator for producing oscillations to be heterodyned with a received high frequency wave, a low frequency amplifier stage for amplifying low frequency signals, and a common source of a direct supply voltage connected to said local oscillator and amplifier stage, means for compensating for frequency variation of said oscillator due to variable loading of said source by said amplifier stage, said means comprising rectifier means connected to the output of said amplifier stage for providing a direct compensating voltage with an amplitude dependent upon the amplitude of signals at the output of said amplifier stage, means providing a voltage proportional to said supply voltage, means combining said proportional voltage and compensating voltages, and means for applying the combined proportional voltage and compensating voltage therefor, whereby said sole operating voltage is independent of fluctuations of said supply voltage due to variable loading of said source.

References Cited by the Examiner

UNITED STATES PATENTS

| | | | |
|---|---|---|---|
| 1,916,358 | 7/33 | Bruce et al. | 325—303 X |
| 2,058,365 | 10/36 | Case | 204—222 |
| 2,853,602 | 9/58 | Farber | 325—319 |
| 2,934,641 | 4/60 | Lin | 325—319 |
| 2,939,950 | 6/60 | Holmes | 325—397 |
| 3,003,115 | 10/61 | Stull | 330—138 |

DAVID G. REDINBAUGH, *Primary Examiner.*

SAMUEL B. PRITCHARD, *Examiner.*